(12) United States Patent
An

(10) Patent No.: US 6,194,767 B1
(45) Date of Patent: Feb. 27, 2001

(54) X-ROM SEMICONDUCTOR MEMORY DEVICE

(75) Inventor: Jin Hong An, Kyungsangbuk-do (KR)

(73) Assignee: Gold Star Electron Co., Ltd. (KR)

(*) Notice: Subject to any disclaimer, the term of this patent is extended or adjusted under 35 U.S.C. 154(b) by 1443 days.

(21) Appl. No.: 08/495,039

(22) Filed: Jun. 27, 1995

Related U.S. Application Data

(63) Continuation of application No. 08/149,704, filed on Nov. 9, 1993, now abandoned, which is a continuation of application No. 07/714,761, filed on Jun. 12, 1991, now abandoned.

(30) Foreign Application Priority Data

Jun. 12, 1990 (KR) .................................................. 90/8624

(51) Int. Cl.$^7$ .................................................. H01L 29/76
(52) U.S. Cl. .......................................... 257/390; 257/391
(58) Field of Search ............................ 365/104; 257/390, 257/391, 207, 208

(56) References Cited

U.S. PATENT DOCUMENTS 4,603,341 * 7/1986 Berlin et al. ............................ 257/70

* cited by examiner

Primary Examiner—Mahshid Saadat
Assistant Examiner—G. Eckert
(74) Attorney, Agent, or Firm—Faegre & Benson LLP

(57) ABSTRACT

In an X-ROM memory device both metal changeable GND lines and polysilicon changeable GND lines are used as a changeable GND line. The metal changeable GND lines are respectively located on both sides of an array of a fixed number of polysilicon changeable GND lines. Odd polysilicon changeable GND lines are commonly connected to one metal changeable GND line through a predetermined polysilicon line, and even polysilicon changeable GND lines are commonly connected to the other metal changeable GND line through another predetermined polysilicon line. Each of the metal changeable GND lines are then connected to a GND terminal through the driving cell transistors.

4 Claims, 3 Drawing Sheets

X-ROM SEMICONDUCTOR MEMORY DEVICE

This is a continuation of application Ser. No. 08/149,704, filed on Nov. 9, 1993, now abandoned, which is a continuation of Ser. No. 07/714,761 filed on Jun. 12, 1991 now abandoned.

BACKGROUND OF THE INVENTION

The present invention relates to an X shaped ROM semiconductor memory device hereinafter referred to as an X-ROM memory device, and may be applied particularly to an improved X-ROM to improve the density of integration when fabricating a mask ROM and an erasable and programmable ROM.

Conventionally, an X-ROM contact region can hold a plurality of cells arranged in the shape of an X, with their center on a contact region.

Accordingly, X-ROM semiconductor memory devices are widely used to increase the density of integration.

FIG. 1 shows a structure of a standard mask ROM to store information permanently by using a mask in accordance with the prior art.

As shown in FIG. 1, a ROM comprises a plurality of cell transistors, each having a storage capacity of 1 bit, a word line connected to the cell transistors, a GND (ground) line connected to each of the cell transistors, and a plurality of bit lines and contact regions for connecting to each of the cell transistors.

Herein, FETs (Field-Effect Transistors) are utilized as the cell transistors.

The density of integration of said mask ROMs is not optional, since a contact region is required to be respectively formed for each cell transistor as illustrated in FIG. 1.

FIG. 2 is a layout diagram of an X-ROM that improves the density of integration. In it, the word lines 1 are successively arranged horizontally at regular intervals in the vertical direction and cell transistors Q (herein FETs are utilized as cell transistors) are successively connected to each word line 1 at regular intervals in the horizontal direction. The changeable, or switchable ground line 3 and the bit line 2 are successively arranged in turn perpendicularly crossing each word line 1. Contact regions 4 are formed between word lines to hold four transistors in common concurrently.

In FIG. 2, the hatched regions are used to denote an active semiconductor region formed in accordance with standard practice.

FIG. 3 is a partial circuit of the portion of an X-ROM corresponding to a representative one word line as illustrated in FIG. 2. In FIG. 3, the cell transistors Q are successively arranged in turn through the contact region 4. Each cell transistor is successively connected to: (i) a word line 1 at regular intervals, (ii) a changeable GND line 3, and (iii) a the bit line 2.

Each sense amplifying cell transistor Qc is connected to the corresponding bit line 2. The driving cell transistors Qa are respectively connected to the corresponding odd changeable GND lines 3 and the driving cell transistors Qb are connected to the even changeable GND lines 3.

Accordingly, the required lines among the changeable GND lines 3 are grounded by the control signals S1 and S2 applied to gates of the driving cell transistors Qa and Qb. Other lines are floating or precharged with the predetermined voltage from a separate circuit which is not shown.

Herein, control signals S3 through S5 are applied to the gates of the sense amplifying cell transistors Qc to output only the output signals of those cell transistors Qc corresponding to the designated address.

As aforesaid, the GND lines of such an X-ROM in the prior art are referred to as changeable or switchable GND lines, since only the required GND lines are selected by control signals S1 and S2 to be grounded.

Furthermore, as shown in FIG. 2, because one contact region 4 is commonly in use for the four cell transistors formed around it in the shape of an X, the density of integration of the prior art X-ROM is higher than that of a conventional H-ROM.

In FIG. 2 and FIG. 3, the word line 1 is made of polysilicon and the bit line 2 and the changeable GND line are made of metal.

The hatched region of FIG. 2 shows the active semiconductor region. Cell transistors formed in the active region, the word line 1, the bit line 2, and the changeable GND line 3 are connected to each other by the active region.

The operation of conventional X-ROMs having the aforesaid structure will be described in more detail.

First, if control signal S1 or S2 is applied to the gates of the driving cell transistors Qa or Qb, the odd or even changeable GND lines 3 are respectively selected. Then charges which are precharged between the cell transistor Q and the bit line 2 with the predetermined voltage from the separate circuit are discharged to the selected changeable GND line 3 through the corresponding cell transistor.

At this time, the voltage state is dropped in the bit line 2 and the voltage drop state is sensed in its low level state by the sense amplifying cell transistors which correspond to the selected changeable GND lines 3 connected to outputs of bit lines 2.

Conversely, when the ROM is programmed to prevent current flow through the cell transistors Q, no voltage drop is generated in the bit line 2 and the high level state is sensed by the sense amplifying cell transistors Qc.

The method used for programming said cell transistors Q consists of enhancing the threshold voltage by injecting the charge to the floating gate as in an erasable and programmable ROM using a floating gate. The partial circuit of the X-ROM as shown in FIG. 3 utilizes the method of removing the active region as the method for programming said cell transistors.

As above-mentioned, the structure of the prior art X-ROM as shown in FIG. 2 and FIG. 3 can improve the density of integration of the device as compared with a conventional H-ROM, since four transistors, each of which is connected to a word line 1, are formed to share one contact region.

But, because the same metal conductive material is used for both the bit line 2 and the changeable GND line 3 in the prior art X-ROM, they need to be formed at regular intervals. Accordingly, because of this inherent constraint there is a limit to reduction of the design dimensions, so that the highest-density of integration cannot be achieved.

Furthermore, because the selecting cell transistors are each connected to a corresponding changeable GND line, the most effective highest-density integration cannot be achieved.

SUMMARY OF THE INVENTION

An object of the present invention is to provide an X-ROM wherein the density of integration of the device is improved. This is accomplished by forming some portions of the changeable GND line using metal and other portions using polysilicon. This then allows arranging both such portions of said changeable GND line efficiently in a unique arrangement.

According to the preferred embodiment of the present invention, as shown in FIG. 4, there is provided an improved X-ROM wherein horizontally elongated polysilicon word lines 1 are successively arranged, and a plurality of cell transistors are horizontally connected to each polysilicon word line. Then, metal bit line 2 and metal changeable GND lines are formed in turn between cell transistors in the direction crossing the polysilicon word line. Each contact region is formed to be disposed at the center of the place in which four cell transistors are formed in the shape of the X. The improvement characterized is that a polysilicon changeable GND line together with said metal changeable GND line is formed as a changeable GND line. A metal changeable GND line is respectively located on either side of a fixed number n of polysilicon changeable GND lines. The odd polysilicon changeable GND lines are connected in common to one metal changeable GND line through a conducting polysilicon changeable GND line. The even polysilicon changeable GND lines are connected in common to the other metal changeable GND line through the designated polysilicon line. Each metal changeable GND line is then grounded through the respective driving cell transistors.

DETAILED DESCRIPTION OF THE PREFERRED EMBODIMENT

The preferred embodiment of the present invention will be described with reference to the accompanying FIG. 4 through FIG. 7.

Figure 1:
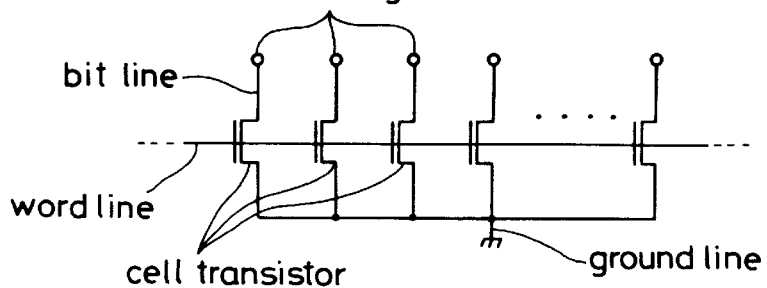
FIG. 1 is a circuit diagram showing a structure of a standard ROM of the prior art.
Figure 2:
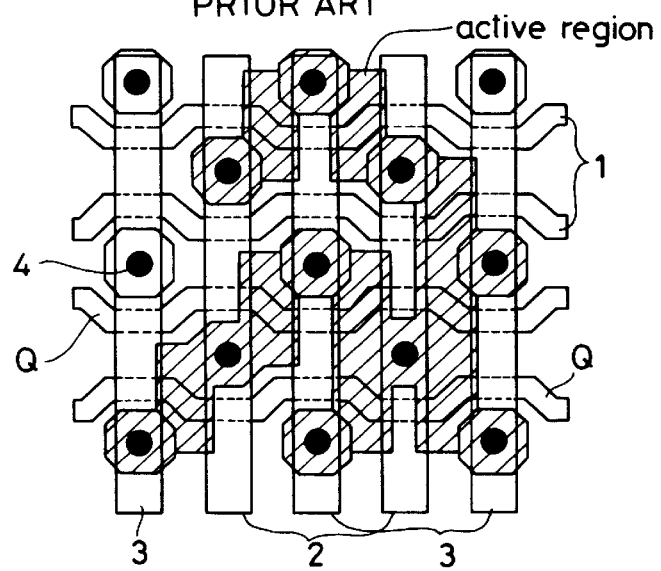
FIG. 2 is a lay-out diagram of an X-ROM of the prior art.
Figure 4:
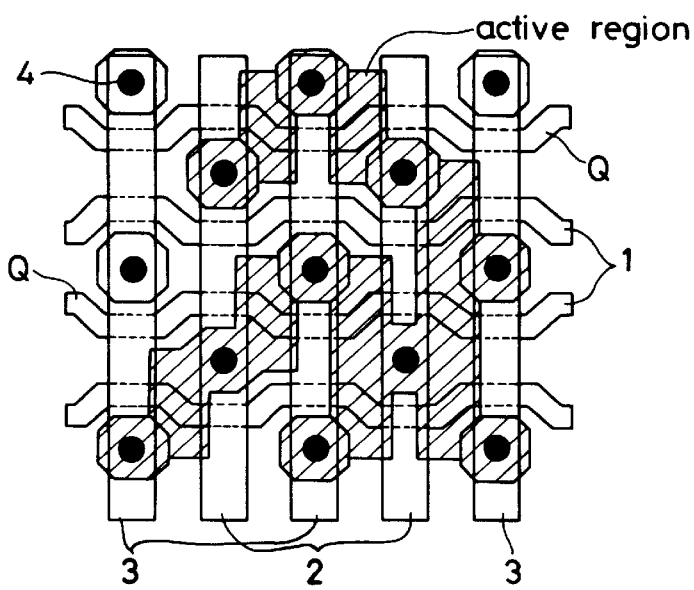
FIG. 4 is a lay-out diagram of an improved X-ROM according to the present invention.

First, FIG. 4 is a lay-out diagram of an X-ROM according to the present invention, which is geometrically identical with that of an X-ROM of the prior art as shown in FIG. 2.

That is, the word lines 1 are horizontally elongated and are successively arranged at regular vertical intervals. A plurality of cell transistors Q are successively arranged at regular intervals and are connected to each word line 1. The cell transistors are FETs formed using standard processes. Bit lines 2 and the changeable GND lines 3 are formed in turn successively in the vertical direction crossing said word lines 1. Contact regions 4 are disposed at the places in which four cell transistors are connected to the designated word lines 1 and are arranged generally in the shape of X with the contact at the center.

Herein, the structural differences between the present invention X-ROM and the prior art X-ROM is that the changeable GND lines 3 are formed of two distinct types of different materials. The two classes or types are metal changeable GND lines 3a and polysilicon changeable GND lines 3b. The word lines 1 and bit lines 2 are made of polysilicon and metal respectively, the same materials used in the prior art. They are formed using standard manufacturing processes. The polysilicons used for the word line 1 and the changeable GND line 3 have a component different from each other.

The relationship between metal changeable GND lines 3a and polysilicon changeable GND lines 3b will be described in more detail hereinafter.

Figure 5:
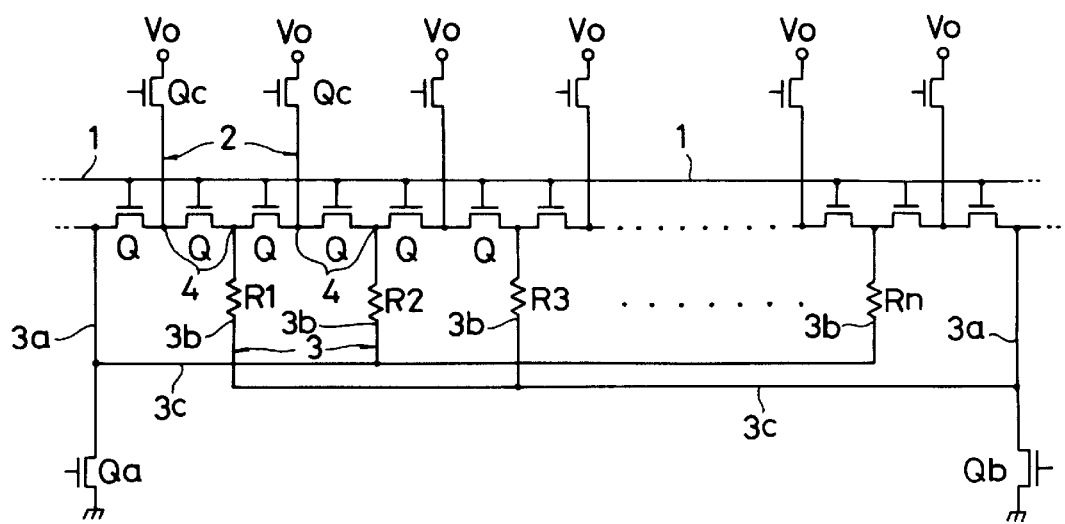
FIG. 5 is a partial circuit diagram of the portion corresponding to one word line of FIG. 3.

FIG. 5 is a detailed circuit diagram of the portion of an X-ROM of the present invention corresponding to one word line 1 of FIG. 4. The X-ROM in the present invention is structurally similar to the prior art X-ROM in that a plurality of cell transistors Q are successively arranged at regular horizontal intervals and in that the bit line 2 and the changeable GND line 3 are successively arranged in turn between cell transistors.

But the particular structural difference in the present invention X-ROM compared with the structure of conventional X-ROMs is that one metal changeable GND line 3a is respectively formed at either side of each of a plurality of n (where n is a positive integer) polysilicon changeable GND lines 3b.

Furthermore, the odd lines among said n polysilicon changeable GND lines 3b are connected to one of the metal changeable GND lines 3a through the designated polysilicon line 3, while the even lines are commonly connected to another GND line 3a through a polysilicon line 3c. As aforesaid, outputs of each bit line 2 are made of metal and are connected to sense amplifying cell transistors Qc.

But, only the outputs of the metal changeable GND lines 3a, rather than all the changeable GND lines 3, are connected to the driving transistors Qa and Qb which may in turn be grounded.

As a result of using the unique X-ROM structure of this invention, only two driving cell transistors Qa and Qb are needed to control n+2 changeable GND lines (where n is a positive integer).

As above-mentioned, because the changeable GND line 3 consists of two metal changeable GND lines 3a compared to n polysilicon changeable GND lines 3b, only a minimum separation interval is needed when the polysilicon changeable GND lines 3b and the metal bit lines 2 are formed between cell transistors Q.

Herein, the numeral 4 indicates a contact region and the symbols R1 through Rn indicate the resistance components inherent to the n polysilicon material of the polysilicon changeable GND lines 3b. Because the resistance component is almost non-existent for the metal GND lines 3a, it is not similarly designated. The resistance component degrades the noise margin and speed characteristics. A method for reducing said effects will be described in more detail hereinafter.

Figure 3:
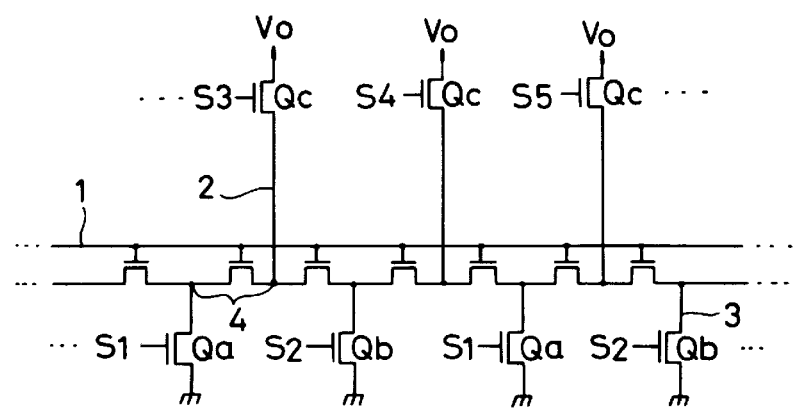
FIG. 3 is a partial circuit diagram of the X-ROM portion corresponding to one word line in FIG. 2.

The operation of the structure according to FIG. 5 is generally similar to that of FIG. 3.

That is, the odd numbered polysilicon changeable GND lines of 3b and the even numbered polysilicon changeable GND lines of 3b are respectively selected by the driving cell transistors Qa or Qb. At this time, charges are discharged through one of the metal changeable GND lines 3a through a cell transistor Q corresponding to the selected odd or even polysilicon changeable GND line 3b and the polysilicon changeable GND line 3b. The predetermined voltage is precharged between the cell transistor Q and the bit line 2 by a separate circuit.

At this time, a voltage is dropped in bit line 2. It is sensed with the high state and the low state of the cell transistors corresponding to the selected odd or even polysilicon changeable GND lines 3b among the cell transistors Qc connected to outputs of bit lines 2.

Figure 6:
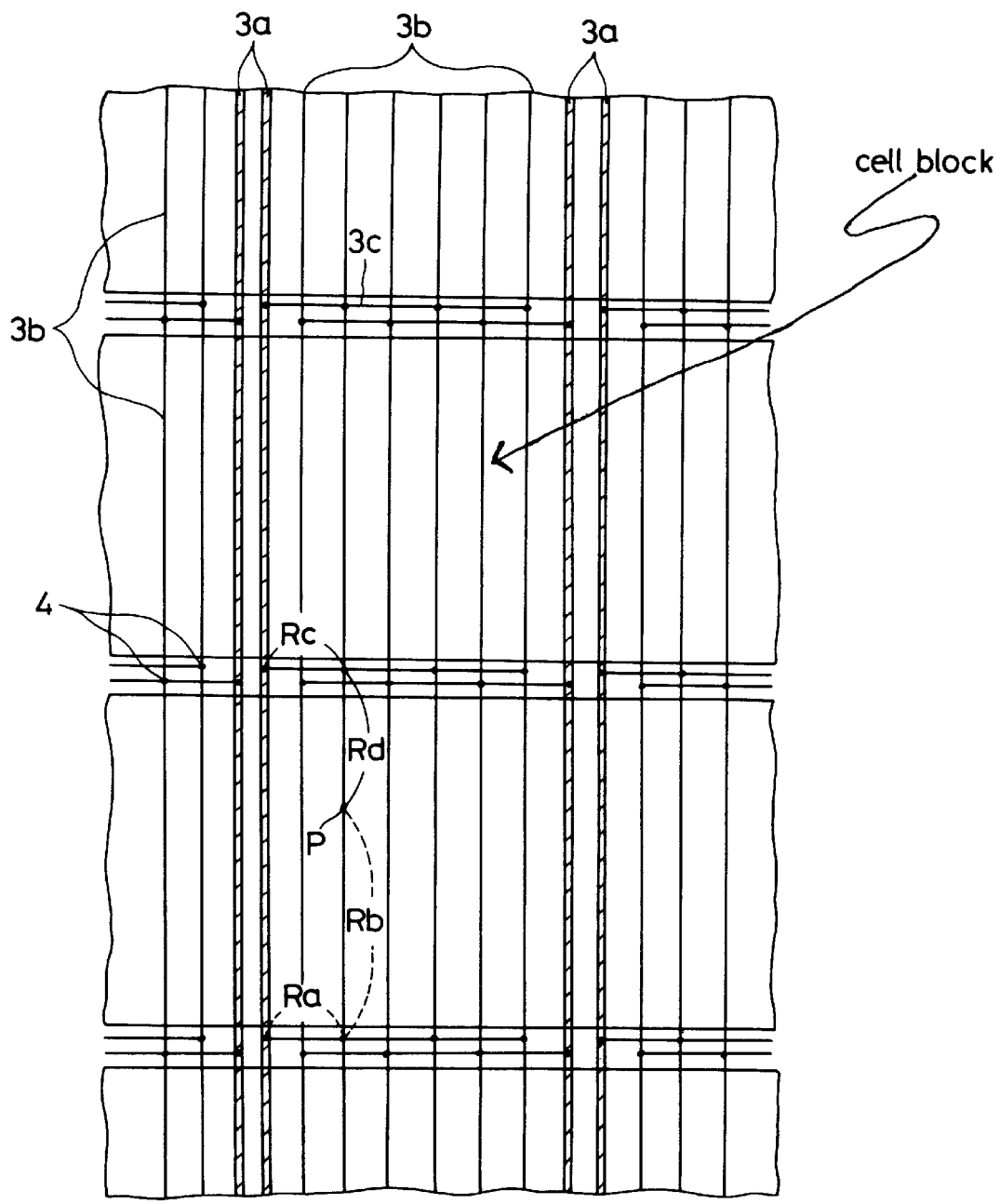
FIG. 6 is an illustrating diagram to show a structure of a changeable GND line according to the present invention.

FIG. 6 shows the connection relation of the polysilicon changeable GND lines 3b to the metal changeable GND lines 3a, when the number n of said polysilicon changeable GND lines 3b is six.

As illustrated in FIG. 5, one metal changeable GND line 3a is formed at either side of said polysilicon changeable GND lines 3b. The odd polysilicon changeable GND lines of 3b are commonly connected to one metal changeable GND line 3a through the conducting polysilicon line 3c. The even polysilicon changeable GND lines among 3b are connected to the other metal changeable GND line 3a through the designated polysilicon line 3c.

At this time, the doping component and characteristics of said designated polysilicon line 3c are at a different, or first, doping level from that of the polysilicon changeable GND lines 3b, which are at a second doping level. Word line 1 is also at the first level. A silicide changeable GND line may alternatively be used in place of the polysilicon changeable GND lines.

On the other hand, because the polysilicon is characterized by a large resistance component as above-mentioned, in order to reduce the resistance component, it is advantageous that the connection structure of said metal changeable GND line 3a and polysilicon changeable GND line 3b be appropriately made in each designated cell block. But, if this requires frequently making the connection structure, the density of integration of the device is decreased.

The symbols Ra, Rb, Rc and Rd in FIG. 6 indicate the individual resistance components of the polysilicon changeable GND lines 3b at the point P.

Figure 7:
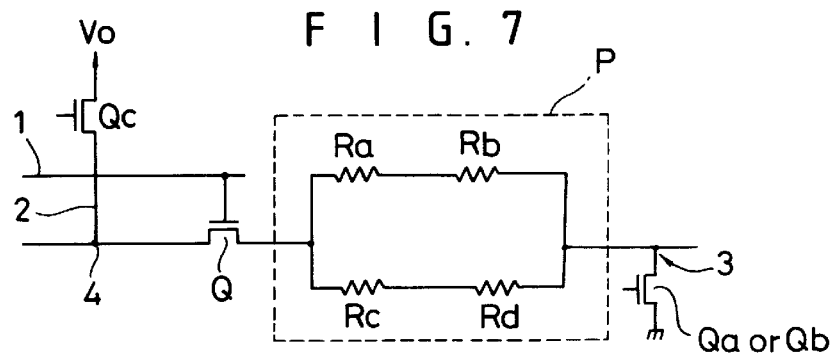
FIG. 7 is an equivalent circuit diagram of the portion corresponding to a point P on FIG. 6.

FIG. 7 is an equivalent circuit diagram of the portion corresponding to said point P. The magnitude of the resistance Rp at the point P can be expressed by the following formula (1):

$$Rp = Ra + Rb // Rc + Rd. \quad (1)$$

That is, the metal changeable GND lines 3a are connected to the designated cell transistor Q through the polysilicon line 3c having the resistance value Ra, the polysilicon changeable GND line 3b having the resistance value Rb, in parallel with the polysilicon changeable GND line 3c having the resistance value Rc and the polysilicon changeable GND line 3b having the resistance value Rd. Rp is the combined value of said resistances.

Said resistance value Rp prevents the current from freely flowing through the cell transistor Q and prevents the voltage from dropping through the bit line 2, which would degrade the noise margin characteristic of the sense amplifying cell transistor Qc and the speed characteristic of the X-ROM.

On the other hand, FIG. 6 shows only the connection state of the changeable GND lines 3. But in practice, word line 1 is made of polysilicon having a different component from the polysilicon changeable GND line 3b. Cell transistor Q and bit line 2 made of metal are arranged between polysilicon changeable GND lines 3b.

As aforesaid the effect according to the present invention is as follows.

The changeable GND lines are formed as metal changeable GND lines and as high resistance polysilicon changeable GND lines, thereby minimizing the spacing interval needed between metal bit lines and metal changeable GND lines.

Accordingly, the density of integration of a X-ROM can be improved.

Furthermore, if the spacing interval between a bit line and a changeable GND line is minimized, the cell size of the word line is decreased.

Then, by reducing the length of a word line, the speed delay of an X-ROM in generating a word line is decreased.

Furthermore, in proportion to the reduction of a cell size, the electrostatic capacitance of a bit line is reduced and other speeds may be improved.

What is claimed is:

1. In an X-shaped ROM semiconductor memory device of the type including:

a plurality of elongated polysilicon word lines arranged in vertically spaced rows, a plurality of horizontally spaced cell transistors electrically connected to the polysilicon word lines, a plurality of elongated metal bit lines and elongated selectable ground lines alternately arranged in horizontally spaced columns between the cell transistors, contact regions for connecting adjacent cell transistors, and a ground terminal;

the improvement characterized by said selectable ground lines including:

groups of adjacent odd and even polysilicon selectable ground lines, a first and a second metal selectable ground line on opposite sides of each group of polysilicon selectable ground lines, a first polysilicon interconnect line for interconnecting the odd polysilicon selectable ground lines of each group of polysilicon selectable ground lines to the first metal selectable ground line, a second polysilicon interconnect line for interconnecting the even polysilicon selectable ground lines of each group of polysilicon selectable ground lines to the second metal selectable ground line, and first and second driving transistors for connecting the first and second metal selectable ground lines, respectively, to the ground terminal.

2. The X-shaped ROM semiconductor memory device of claim 1 wherein:

the polysilicon word lines are of a first polysilicon composition, and the polysilicon selectable ground lines are of a second polysilicon composition which is different than the first polysilicon composition.

3. The X-shaped ROM semiconductor memory device of claim 1 wherein the number of selectable polysilicon ground lines is a positive integer and a multiple of 2.

4. In an X-shaped ROM semiconductor memory device of the type including:

a plurality of elongated polysilicon word lines arranged in vertically spaced rows, a plurality of horizontally spaced cell transistors connected to the polysilicon word lines, a plurality of elongated metal bit lines and elongated selectable ground lines alternately arranged in horizontally spaced columns between the cell transistors, contact regions for connecting adjacent cell transistors, and a ground terminal;

the improvement characterized by said selectable ground lines including:

groups of adjacent odd and even silicide selectable ground lines, a first and a second metal selectable ground line on opposite sides of each group of silicide selectable ground lines, a first polysilicon interconnect line for interconnecting the odd silicide selectable ground lines of each group to the first metal selectable ground line, a second polysilicon interconnect line for interconnecting the even silicide selectable ground lines of each group to the second metal selectable ground line, and a first driving transistor and a second driving transistor for connecting the first and second metal selectable ground lines, respectively, to the ground terminal.

* * * * *